United States Patent [19]
Yang

[11] Patent Number: 4,766,328
[45] Date of Patent: Aug. 23, 1988

[54] PROGRAMMABLE PULSE GENERATOR

[75] Inventor: Ta-Yung Yang, Tao Yuan, Taiwan

[73] Assignee: System-General Corporation, Taichung, Taiwan

[21] Appl. No.: 53,681

[22] Filed: May 26, 1987

[51] Int. Cl.$^4$ .......................................... H03K 13/02
[52] U.S. Cl. ............................. 307/106; 340/347 SH; 340/347 CC; 340/347 DA; 307/107
[58] Field of Search .............. 307/106, 107, 110, 108, 307/109, 415, 419, 416, 412, 417, 418; 328/65, 67, 53, 59, 74; 340/347 M, 347 R, 347 NT, 347 DA, 347 CC, 347 SH; 364/605

[56] References Cited

U.S. PATENT DOCUMENTS

| | | | |
|---|---|---|---|
| 3,345,505 | 10/1967 | Schmid | 340/347 DA X |
| 3,794,995 | 2/1974 | Thompson | 340/347 DA X |
| 3,877,023 | 4/1975 | Spicer et al. | 340/347 DA |
| 3,903,506 | 9/1975 | Katagi | 340/347 DA |
| 3,984,830 | 10/1976 | Buchanan et al. | 340/347 DA |
| 3,995,266 | 11/1976 | Muller et al. | 340/347 DA |
| 4,229,703 | 10/1980 | Bustin | 340/347 CC X |
| 4,430,642 | 2/1984 | Weigand et al. | 340/347 DA |
| 4,488,144 | 12/1984 | Wollman | 340/347 M X |
| 4,503,421 | 3/1985 | Hareyama et al. | 340/347 CC X |
| 4,538,266 | 8/1985 | Miki | 340/347 CC X |
| 4,673,916 | 6/1987 | Kitamura et al. | 340/347 SH |

*Primary Examiner*—William M. Shoop, Jr.
*Assistant Examiner*—Paul Ip
*Attorney, Agent, or Firm*—Birch, Stewart, Kolasch & Birch

[57] ABSTRACT

The present invention discloses a programmable pulse generator comprising a digital information processing system generating first and second program-controlled signals; a first digital-to-analog converter coupled to the digital information processing system, generating a first current signal in response to the first program-controlled signal; a second digital-to-analog converter coupled to the digital information processing system, generating a second current signal in response to the second program-controlled signal; and a differential amplifier having a feedback resistor, coupled to the first and second digital-to-analog converters respectively, and generating a pusle signal in response to the first and second current signals wherein the voltage and pulse width of the pulse signal are responsive to the first current signal, and the slew rate of the pulse is responsive to the second current signal.

8 Claims, 4 Drawing Sheets

PROGRAMMABLE PULSE GENERATOR

BACKGROUND OF THE INVENTION

The present invention relates to a pulse generator, and more particularly to a programmable pulse generator in which the voltage, pulse width and slew rate of a pulse generated by the pulse generator are capable of being varied and controlled by the user as desired.

Nowadays, various integrated circuit programmers are widely used to program various programmable logic devices, such as programmable array logics (PAL), integrated fuse logics (IFL), bipolar programmable read only memories (BPROM), erasable programmable read only memories (EPROM), erasable programmable logic devices (EPLD), etc. In the programming process, the integrated circuit programmer must provide a pulse signal for the programmable logic device which is being programmed, with different programmable logic devices needing different pulse signals. Currently, this is accomplished by using different hardware circuits for each logic device, an uneconomic process.

SUMMARY OF THE INVENTION

The primary object of the present invention is to provide a programmable pulse generator which, using a single pulse generating circuit, will provide different pulse signals for different programable logic devices.

In accordance with the present invention, a programmable pulse generator comprises a digital information processing system, generating first and second program-controlled signals; a first digital-to-analog converter coupled to the digital information processing system, generating a first current signal in response to the first program-controlled signal; a second digital-to-analog converter coupled to the digital information processing system, generating a second current signal in response to the second program-controlled signal; and a differential amplifier having a feedback resistor, coupled to the first and second digital-to-analog converters respectively, and generating a pulse signal in response to the first and second current signals wherein the voltage and pulse width of the pulse signal are responsive to the first current signal, and the slew rate of the pulse is responsive to the second current signal.

BRIEF DESCRIPTION OF THE DRAWINGS

The present invention can be more fully understood by reference to the following detailed description and accompanying drawings, which form an integral part of this application.

DETAILED DESCRIPTION OF THE PREFERRED EMBODIMENT

Figure 1:
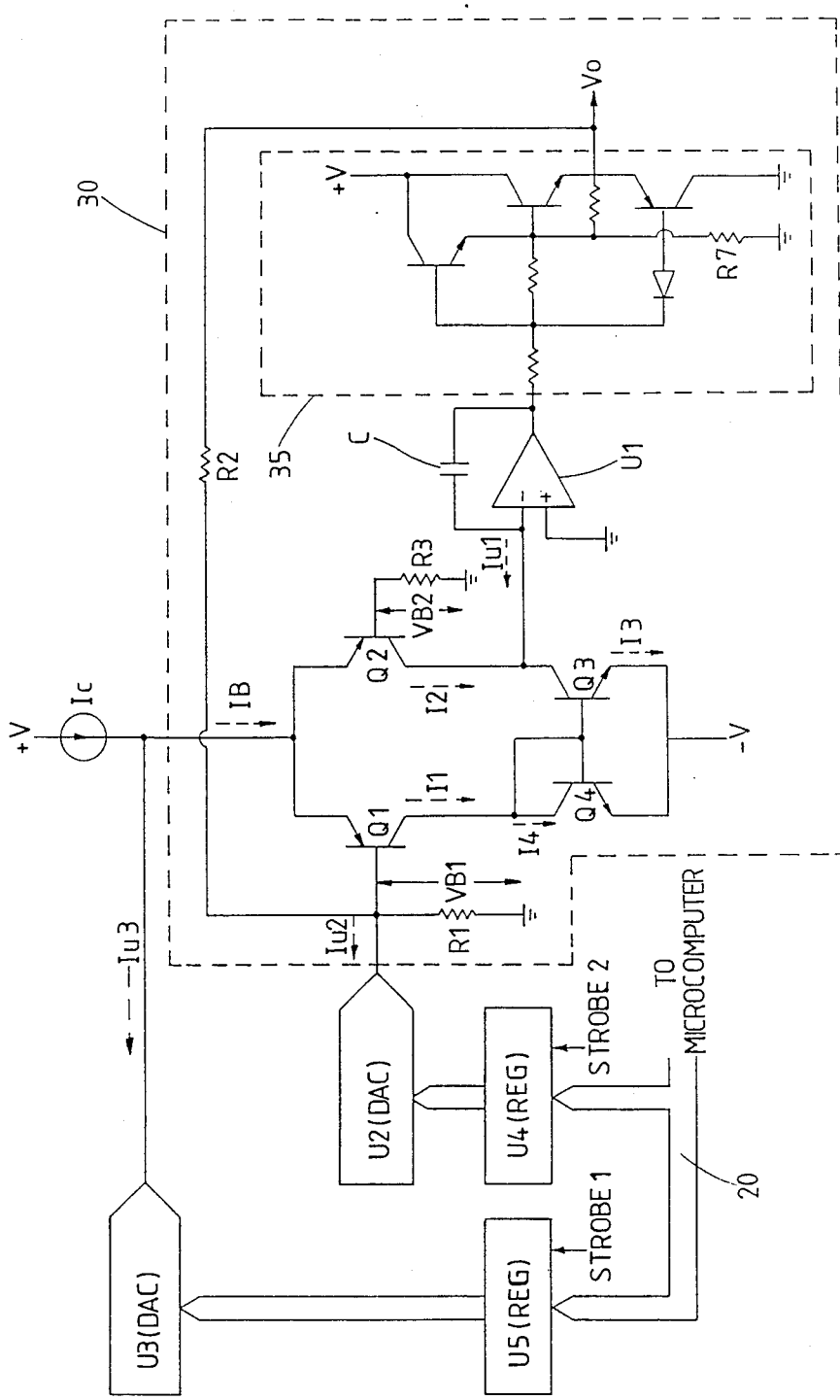
FIG. 1 is a schematical electrical diagram of the programmable pulse generating circuit in accordance with the preferred embodiment of the present invention.

Referring now to FIG. 1, a programmable pulse generating circuit includes two registers U4 and U5 which are coupled to a digital information processing system or a microcomputer (not shown) via a data bus 20, and act as buffers. Two digital-to-analog converters (D/A converters) U2 and U3 are coupled to the registers U4 and U5 respectively. The registers U4 and U5 are enabled by the microcomputer via STROBE 1 and STROBE 2 respectively, and receive respective digital control codes supplied by the microcomputer through the data bus 20. The outputs of the D/A converters U2 and U3 are of the open collector type, and thus their output sink current can be controlled by the digital control codes. The digital control codes can be varied and controlled by the microcomputer during the time in which a proper program is running. Since this is known to those who are ordinarily skilled in the art, detailed description of this is unnecessary.

Figure 2:
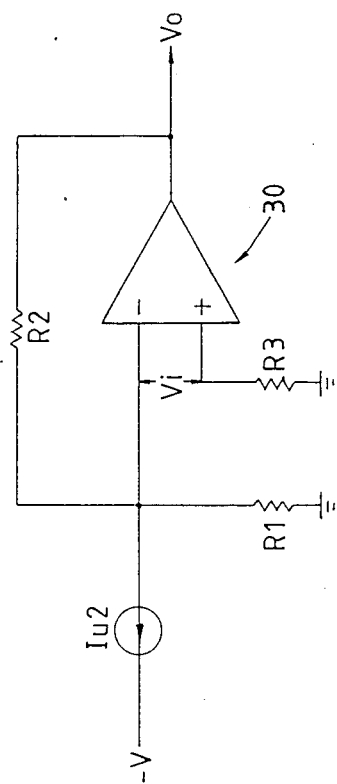
FIG. 2 is a simplified electrical diagram of the differential amplifier with a feedback resistor, shown in the larger dashed block in FIG. 1.
Figure 3:
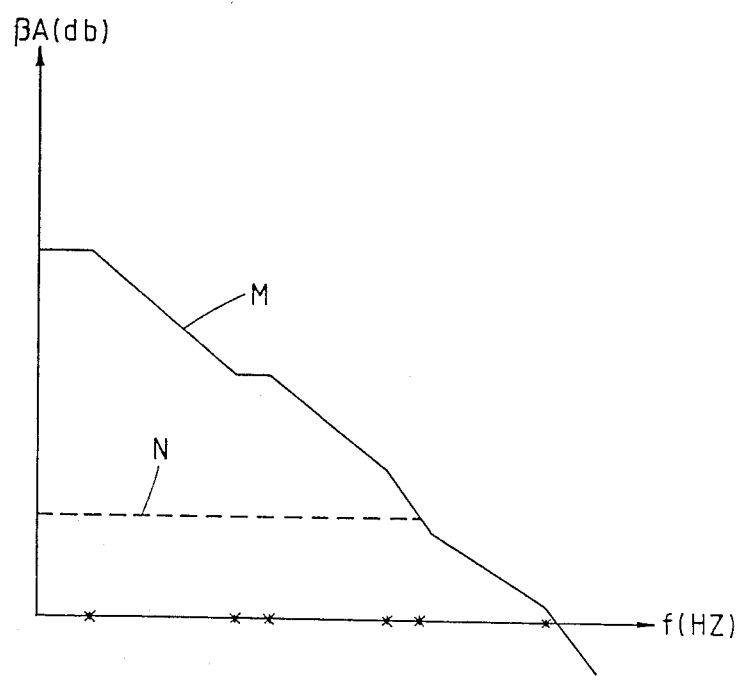
FIG. 3 shows characteristic curves of the loop gains of the differential amplifiers with and without a grounded resistor.

The output of the D/A converter U2 is coupled to the input of a differential amplifier 30. The differential amplifier 30 includes a differential input stage formed by four transistors Q1, Q2, Q3 and Q4, and having a high input impedance. The output of the differential input stage is coupled to an integrator which includes an operational amplifier U1 and a feedback integrating capacitor C. The output stage of the differential amplifier 30 is a power push-pull circuit 35 with a low output impedance. The differential amplifier 30 has a feedback resistor R2, and incorporates the output of the D/A converter U2 to form a current-to-voltage converting circuit, the corresponding electrical diagram of which is shown in FIG. 2. The value of the resistor R3 of the differential amplifier 30 is determined by the following equation:

$$R3 = (R1 \times R2)/(R1 + R2)$$

to eliminate the error caused by the offset current. The differential amplifier 30 with feedback is susceptible to instability because there are several poles resulting from the phase shifts of the components in the differential amplifier 30. Thus, a grounded resistor R1 is utilized to reduce the loop gain with feedback $\beta \cdot A$ [$\beta \cdot A = A \times (R1/R1 + R2)$, wherein A represents the open-loop gain of the differential amplifier 30], and thus greatly improves the stability of the circuitry. With reference to FIG. 3, the solid line M represents the characteristic curve of the loop gain when the resistor R1 is not included in the differential amplifier 30, while the dashed line N represents the characteristic curve of the loop gain when the resistor R1 is included.

The output voltage Vo of the current-to-voltage converting circuit is determined by the following equation:

$$Vo = (Vo/A) \times [(R2+R1)/R1] + Iu2 \times R2$$

When $A \geqq \geqq Vo \times (R2+R1)/R1$, the output voltage $$Vo = Iu2 \times R2.$$

Figure 4:
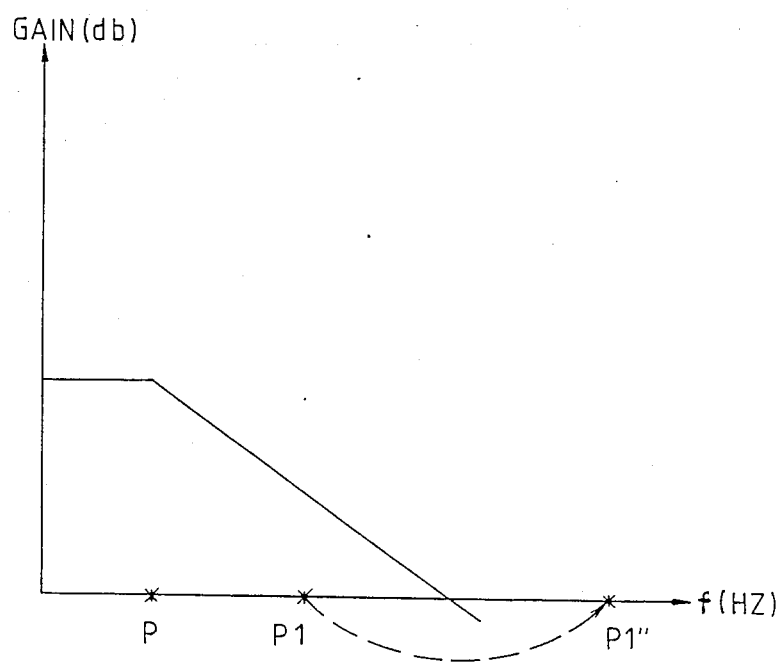
FIG. 4 is a characteristic curve of the loop gain of the differential amplifier shown in FIG. 1 and 2.

Therefore, the D/A converter U2 can control the voltage level and pulse width of the output pulse signal. The power push-pull circuit 35 of the output stage includes a grounded resistor R7 which is utilized to move the pole caused by the load effect ($P1 = \frac{1}{2}\pi \cdot RL \cdot CL$, wherein RL is the resistance of a load and CL is the capacitance of the load) to a higher frequency ($P1'' = \frac{1}{2}\pi \cdot Rp \cdot CL$, wherein $Rp = RL//(R7/\beta)$). Therefore, the frequency response of the differential amplifier 30 is determined only by the dominant pole P resulting from the integrating capacitor C in the integrator, as shown in FIG. 4.

The bias current IB of the differential input stage of the differential amplifier 30 is controlled by the D/A converter U3, i.e. $IB=Ic-Iu3$, wherein Ic is a constant-current source. If the D/A converter U3 is 8 bits and IB equals x ampere, the resolution of IB will equal (x/256).

The characteristics of the currents in the differential input stage are as follows:

$$IB = I1 + I2; \quad (1)$$

$$I3 = I4 \quad (2)$$

(because the transistors Q3 and Q4 form a current mirror circuit); and $$I1 = I4. \quad (3)$$

The linear active region of the differential amplifier occurs in the range where the absolute value of the difference between the input voltages Vb1 and Vb2 is smaller than or equal to $4VT$ ($|VB1-VB2| \leq 4VT$), wherein VT is the voltage equivalent of temperature). In the differential amplifier 30 shown in FIG. 1, the voltage VB2 is approximately zero. Therefore, when we control the input voltage VB1 to make it conform to the following condition:

$$|-VB1| > 4VT,$$

the transistor Q2 will be cut off, and thus the current I1 equals the current IB. Since the current I4 equals the current I1 and the current I3 equals the current I4, as mentioned above, the current I3 equals the current IB. In such an instance, the charging current Iu1 of the integrating capacitor C equals the current I3 or IB (i.e. $Iu1=I3=IB$). If the input voltage VB1 conforms to the following condition:

$$|+VB1| > 4VT,$$

the transistor Q1 will be cut off, and thus the current I2 equals the current IB. In this case, the discharging current Iu1 of the integrating capacitor C equals the current $-I2$ or $-IB$ (i.e. $Iu1=-I2=-IB$). Therefore, when we vary the pulse signal, the rise and fall times of the pulse are all controlled by both the bias current IB and the capacitance of the integrating capacitor C until the feedback reaches a balance. Since $Q=CV=IT$, the slew rate ($\Delta V/\Delta T = IB/C$) is linearly controlled by the combination of the bias current and the integrating capacitance of the differential amplifier 30.

While the invention has been described in terms of what is presently considered to be the most practical and preferred embodiment, it is to be understood that the invention need not be limited to the disclosed embodiment. On the contrary, it is intended to cover various modifications and similar arrangements included within the spirit and scope of the appended claims, the scope of which should be accorded the broadest interruption so as to encompass all such modifications and similar structures.

What is claimed is:

1. A programmable pulse generator comprising:
    a digital information processing system which generates first and second program-controlled signals;
    a first digital-to-analog converter operatively connected to said digital information processing system, generating a first current signal in response to said first program-controlled signal;
    a second digital-to-analog converter operatively connected to said digital information processing system, generating a second current signal in response to said second program-controlled signal; and
    a differential amplifier responsive to said digital information processing system having:
        a differential amplifier input stage operatively connected to said digital-to-analog converters and responsive to said current signals of said digital-to-analog converters wherein the bias current of said differential amplifier input stage is responsive to said second current signal;
        an integrator operatively connected to said differential amplifier input stage and having an integrating capacitor;
        a push-pull output stage operatively connected to said integrator which produces a pulse signal in response to said current signals of said digital-to-analog converters;
        wherein the voltage and pulse width of said pulse signal are responsive to said first current signal and the slew rate of said pulse signal is linearly responsive to the bias current of said differential amplifier input stage and the capacitance of said integrating capacitor; and
        a feedback resistor operatively connected between said push-pull output stage and said differential amplifier input stage.

2. A programmable pulse generator as claimed in claim 1, wherein said differential input stage includes a first grounded resistor at its input terminal to eliminate the instability of said differential amplifier with said feedback resistor.

3. A programmable pulse generator as claimed in claim 2, wherein said push-pull output stage includes a second grounded resistor to stabilize said pulse signal.

4. A programmable pulse generator as claimed in claim 3, wherein the outputs of said first and second digital to analog converters are of the open collector type.

5. A differential amplifier which produces a pulse signal with a predetermined voltage, pulse width, and slew rate in accordance with input signals from a programmable controller comprising:
    an input stage operatively connected to said programmable controller to receive first and second input signals;
    an integrating circuit operatively connected to said input stage and having an integrating capacitor;
    an output stage operatively connected to said integrating circuit to produce said pulse signal; wherein
    said voltage and pulse width of said pulse signal is responsive to said first input signal, and said slew rate of said pulse signal is linearly responsive to said second input signal and the capacitance of said integrating circuit.

6. A differential amplifier as claimed in claim 5 further comprising:
    a feedback resistor operatively connected to said output stage and said input stage.

7. A differential amplifier as claimed in claim 6 further comprising:
    an input stage grounded resistor operatively connected to an input terminal of said input stage to eliminate the instability of said differential amplifier with said feedback resistor.

8. A differential amplifier as claimed in claim 7 further comprising:
    an output stage grounded resistor to stabilize said pulse signal.

* * * * *